(12) United States Patent
Sun et al.

(10) Patent No.: US 8,009,431 B2
(45) Date of Patent: Aug. 30, 2011

(54) COMPUTER HOUSING AND COMPUTER INCLUDING THE SAME

(75) Inventors: Hui-Huang Sun, Taipei Hsien (TW); Chun Chang, Taipei Hsien (TW)

(73) Assignee: Aopen Inc. (TW)

( * ) Notice: Subject to any disclaimer, the term of this patent is extended or adjusted under 35 U.S.C. 154(b) by 89 days.

(21) Appl. No.: 12/550,351

(22) Filed: Aug. 29, 2009

(65) Prior Publication Data

US 2010/0053869 A1    Mar. 4, 2010

(30) Foreign Application Priority Data

Sep. 1, 2008  (TW) .............................. 97215706 U

(51) Int. Cl.
*G06F 1/16*           (2006.01)

(52) U.S. Cl. ................... 361/727; 361/679.54; 361/724; 361/725

(58) Field of Classification Search .................. 361/725, 361/727

See application file for complete search history.

(56) References Cited

U.S. PATENT DOCUMENTS

| | | | | |
|---|---|---|---|---|
| 4,111,328 A | * | 9/1978 | Eggert et al. ................. | 220/4.01 |
| 4,656,559 A | * | 4/1987 | Fathi ............................. | 361/721 |
| 4,884,715 A | * | 12/1989 | Pohlmann ..................... | 220/683 |
| D332,443 S | * | 1/1993 | Sharpe .......................... | D13/184 |
| 5,450,285 A | * | 9/1995 | Schlemmer ................... | 361/724 |
| 5,564,802 A | * | 10/1996 | Chiou ........................... | 312/111 |
| 5,717,575 A | * | 2/1998 | Copeland et al. ............. | 361/756 |
| 5,963,431 A | * | 10/1999 | Stancil .......................... | 361/803 |
| 6,114,626 A | * | 9/2000 | Barnes et al. ................. | 174/542 |
| 6,120,116 A | * | 9/2000 | Phillips ....................... | 312/223.2 |
| 6,151,215 A | * | 11/2000 | Hoffman ...................... | 361/704 |
| 6,297,955 B1 | * | 10/2001 | Frank et al. ............. | 361/679.41 |
| 6,624,448 B2 | * | 9/2003 | Taguchi et al. ............... | 257/150 |
| 6,650,545 B1 | * | 11/2003 | Ootori et al. ................. | 361/729 |
| 6,804,123 B1 | * | 10/2004 | Cheng .......................... | 361/784 |
| 7,040,383 B2 | * | 5/2006 | Oyamada ................. | 165/104.33 |
| 7,136,286 B2 | * | 11/2006 | Chuang ........................ | 361/703 |
| 7,161,804 B2 | * | 1/2007 | Oyamada ..................... | 361/703 |
| 7,566,104 B2 | * | 7/2009 | Chen ......................... | 312/223.2 |
| 7,817,412 B2 | * | 10/2010 | Sullivan ................... | 361/679.33 |
| 2005/0030719 A1 | * | 2/2005 | Lin et al. ....................... | 361/719 |
| 2007/0058336 A1 | * | 3/2007 | Cheng .......................... | 361/687 |
| 2009/0267465 A1 | * | 10/2009 | Cheng ........................ | 312/223.2 |
| 2009/0268394 A1 | * | 10/2009 | Cheng ..................... | 361/679.54 |
| 2009/0309467 A1 | * | 12/2009 | Nelson et al. ............. | 312/223.1 |
| 2010/0202623 A1 | * | 8/2010 | Snider et al. .................... | 381/58 |

* cited by examiner

*Primary Examiner* — Jinhee Lee
*Assistant Examiner* — Anthony Q Edwards
(74) *Attorney, Agent, or Firm* — The Mueller Law Office, P.C.

(57) ABSTRACT

A computer housing is adapted for receiving a motherboard and at least one electronic component therein, and includes a housing unit and a support board. The housing unit has an opening, and includes at least one first sliding portion that is provided at each of two opposite sides of an inner surface of the housing unit, that extends along a sliding direction, and that is connected to the opening. The support board is adapted for securing the motherboard and the electronic component, and includes a second sliding portion provided at each of two opposite edges of the support board and slidable relative to the first sliding portion in the sliding direction.

16 Claims, 10 Drawing Sheets

COMPUTER HOUSING AND COMPUTER INCLUDING THE SAME

CROSS-REFERENCE TO RELATED APPLICATION

This application claims priority of Taiwanese Application No. 097215706, filed on Sep. 1, 2008.

BACKGROUND OF THE INVENTION

1. Field of the Invention

The invention relates to a computer housing, more particularly to a computer housing that adopts a sliding track design so as to be capable of being assembled quickly.

2. Description of the Related Art

Referring to FIG. 1, a computer housing 11 of a conventional computer 1 includes a main housing body 111 and a side plate 112 removably and threadedly secured to the main housing body 111. The main housing body 111 and the side plate 112 cooperatively define a receiving space 113.

Internal components, such as a motherboard 12 and a storage device 13, are positioned within the receiving space 113. The motherboard 12 is locked to one side of the main housing body 111 distal from the side plate 112, and the storage device 13 is locked to a holder within the main housing body 111.

In view of the trend of computer development toward miniaturization, the receiving space 113 of the computer housing 11 is relatively very narrow. When a user intends to assemble the internal components, such as the motherboard 12 and the storage device 13, to the computer housing 11, in general, the internal components are installed in sequence according to the consideration of space. However, since the receiving space 113 is limited and narrow, especially after some of the internal components have been installed, the assembly operation is relatively inconvenient.

Likewise, repair or replacement of the internal components is very inconvenient due to the limited space of the receiving space 113.

SUMMARY OF THE INVENTION

An object of the present invention is to provide a computer housing that adopts a sliding track design so as to be capable of being assembled quickly.

Another object of this invention is to provide a computer that adopts a sliding track design so as to be capable of being assembled quickly.

Accordingly, the computer housing of this invention is adapted for receiving a motherboard therein, and includes a housing unit and a support board. The housing unit has an opening, and includes at least one first sliding portion that is provided at each of two opposite sides of an inner surface of the housing unit, that extends along a sliding direction, and that is connected to the opening. The support board is adapted for securing the motherboard, and includes a second sliding portion provided at each of two opposite edges of the support board and slidable relative to the first sliding portion in the sliding direction.

Preferably, the housing unit further includes a lower housing body, and an upper housing body mounted slidably on the lower housing body along the sliding direction and cooperating with the lower housing body to define a receiving space. The lower housing body includes a bottom plate and two lower side plates extending upwards and respectively from left and right edges of the bottom plate. The upper housing body includes a top plate and two upper side plates extending downwardly and respectively from left and right edges of the top plate. The first sliding portion is provided at one of an inner surface of each of the upper side plates and an inner surface of each of the lower side plates.

Preferably, the housing unit includes two of the first sliding portions, which are respectively provided at each of the two opposite sides of the inner surface of the housing unit, and which are spaced apart from each other. The support board and the housing unit can be assembled in two different ways because of the design of the first sliding portions spaced apart from each other.

Preferably, the first sliding portions are provided at the inner surface of each of the lower side plates.

Preferably, the first sliding portion is a track defined by two plates that are spaced apart from each other and that extend inwardly from the inner surface of the housing unit.

Preferably, the second sliding portion of the support board includes a plurality of tabs projecting from a corresponding one of the edges of the support board and slidably mounted in the track. The frictional resistance that is generated when the support board slides in the front-rear direction is reduced, thereby facilitating removal or insertion of the support board.

Preferably, the two upper side plates and the two lower side plates are respectively formed with at least one third sliding portion and a fourth sliding portion at a portion where the upper and lower side plates are adjacent to one another. The third and fourth sliding portions extend along the sliding direction and are connected slidably to each other.

Preferably, each of the upper side plates has a surface formed with two of the third sliding portions, which are located at different levels. The upper housing body and the lower housing body can be assembled in two different ways because of the design of the third sliding portions spaced apart from each other.

Preferably, the third sliding portions are formed on the inner surface of each of the upper side plates, and the fourth sliding portion is formed on an outer surface of each of the lower side plates.

Preferably, the third sliding portion is constituted by a first ledge and a second ledge that are spaced apart from each other and that extend inwardly from the inner surface of a corresponding one of the upper side plates. The first ledge has a horizontal cross section. The second ledge is disposed below the first ledge and has a cross section of upward hook shape. The fourth sliding portion is a third ledge extending outwardly from the outer surface of a corresponding one of the lower side plates and having a cross section of downward hook shape.

Preferably, the housing unit further includes an end cover removably covering the opening.

Preferably, the bottom plate of the lower housing body has an outer surface that is recessed inwardly to form two mounting grooves that extend along a front-rear direction. The computer housing further includes a mounting plate that includes two mounting portions extending upwardly and respectively from left and right edges of the mounting plate, and a locking portion extending upwardly from a rear edge of the mounting plate. The mounting portions are mounted slidably and respectively in the mounting grooves along the front-rear direction. The locking portion is locked to the end cover at a rear end of the housing unit. Alternatively, the computer housing further includes two resilient strips, each of which is mounted in a corresponding one of the mounting grooves with a portion thereof protruding from the corresponding one of the mounting grooves.

Preferably, the upper housing body and the lower housing body are made via aluminum extrusion so as to reduce manufacturing costs.

Preferably, each of the upper housing body and the lower housing body is formed with a plurality of holes so as to provide a heat dissipating effect.

Preferably, the support board has one surface provided with a plurality of studs for securing the motherboard, and an opposite surface provided with a securing portion for securing at least one electronic component.

The computer of this invention includes a motherboard, at least one electronic component, and a computer housing. Since a description of the computer housing has been provided hereinabove, it will not be repeated herein.

The effect of this invention is that, with the arrangement of the second sliding portions of the support board which are slidable relative to the first sliding portions of the housing unit in the sliding direction, the motherboard and the electronic components secured on the support board can be removed together with the support board, thereby achieving quick assembly with the use of a sliding track design.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

It is particularly noted herein that directional terminologies, such as top, bottom, left, right, front and rear, as used herein are defined in relation to the drawings, and are intended to facilitate description of the present invention rather than limit the scope of the present invention.

Figure 1:
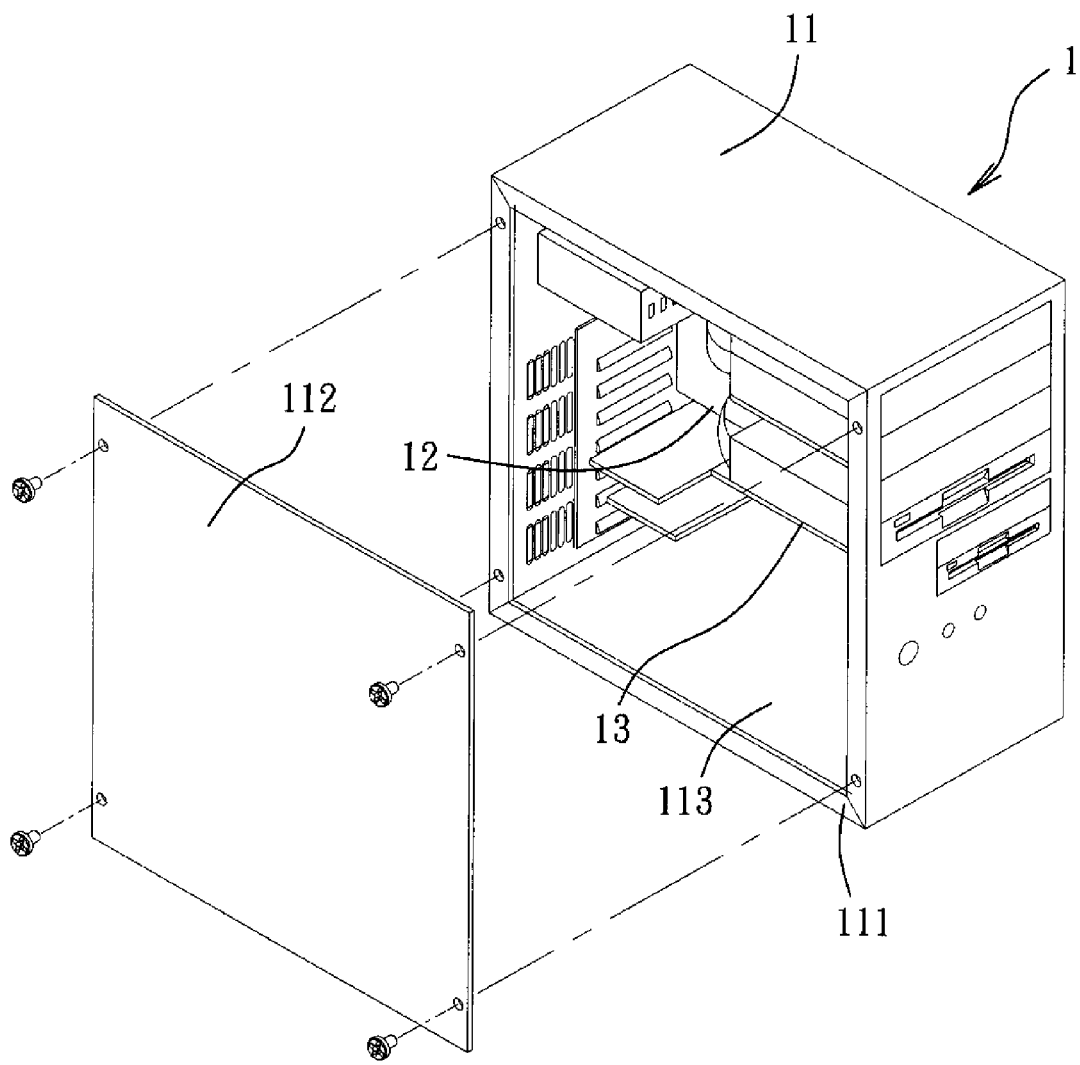
FIG. 1 is a partly exploded perspective view illustrating a conventional computer housing.
Figure 2:
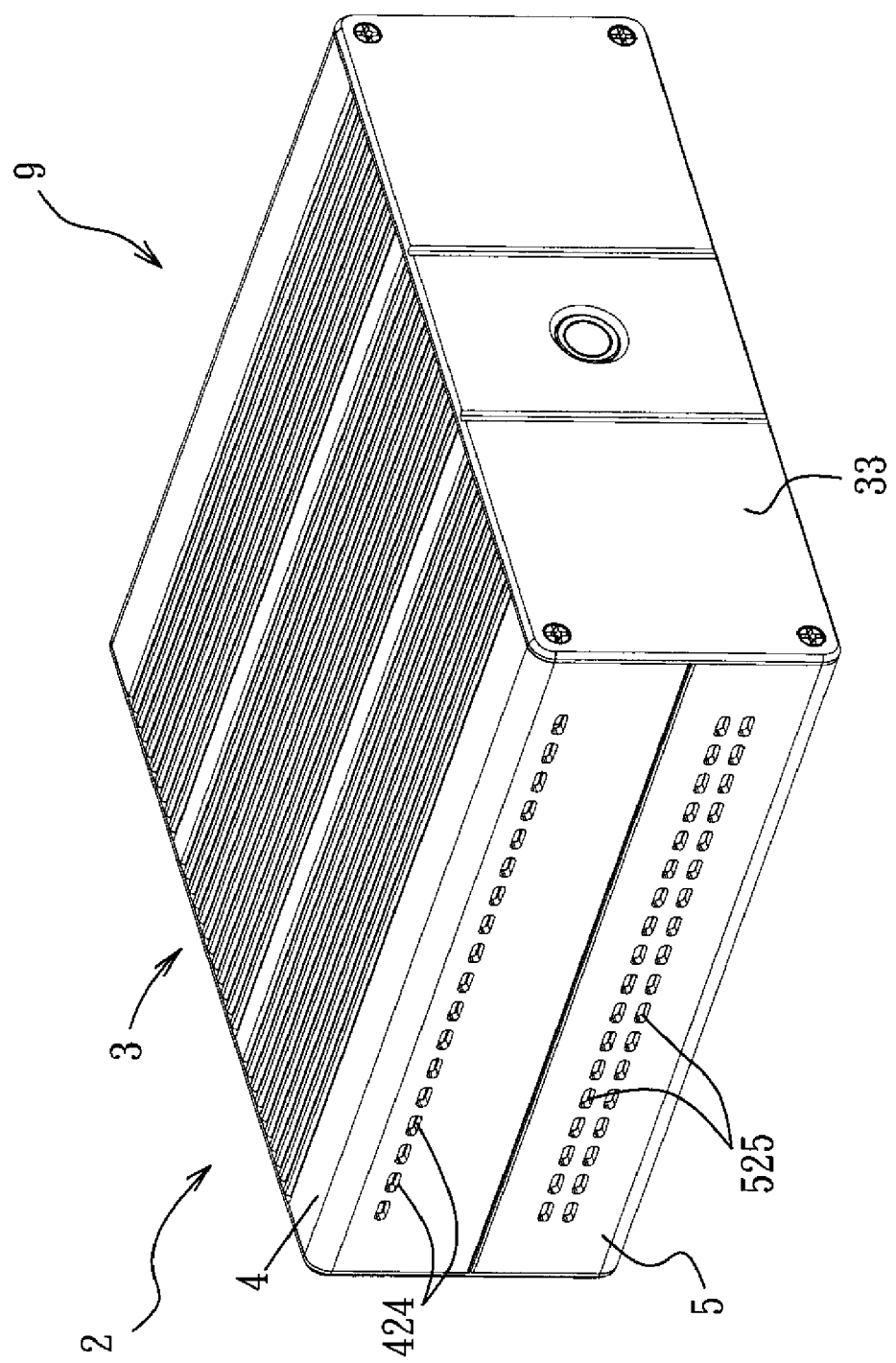
FIG. 2 is a perspective view illustrating a preferred embodiment of a computer according to this invention when assembled in a first way.
Figure 4:
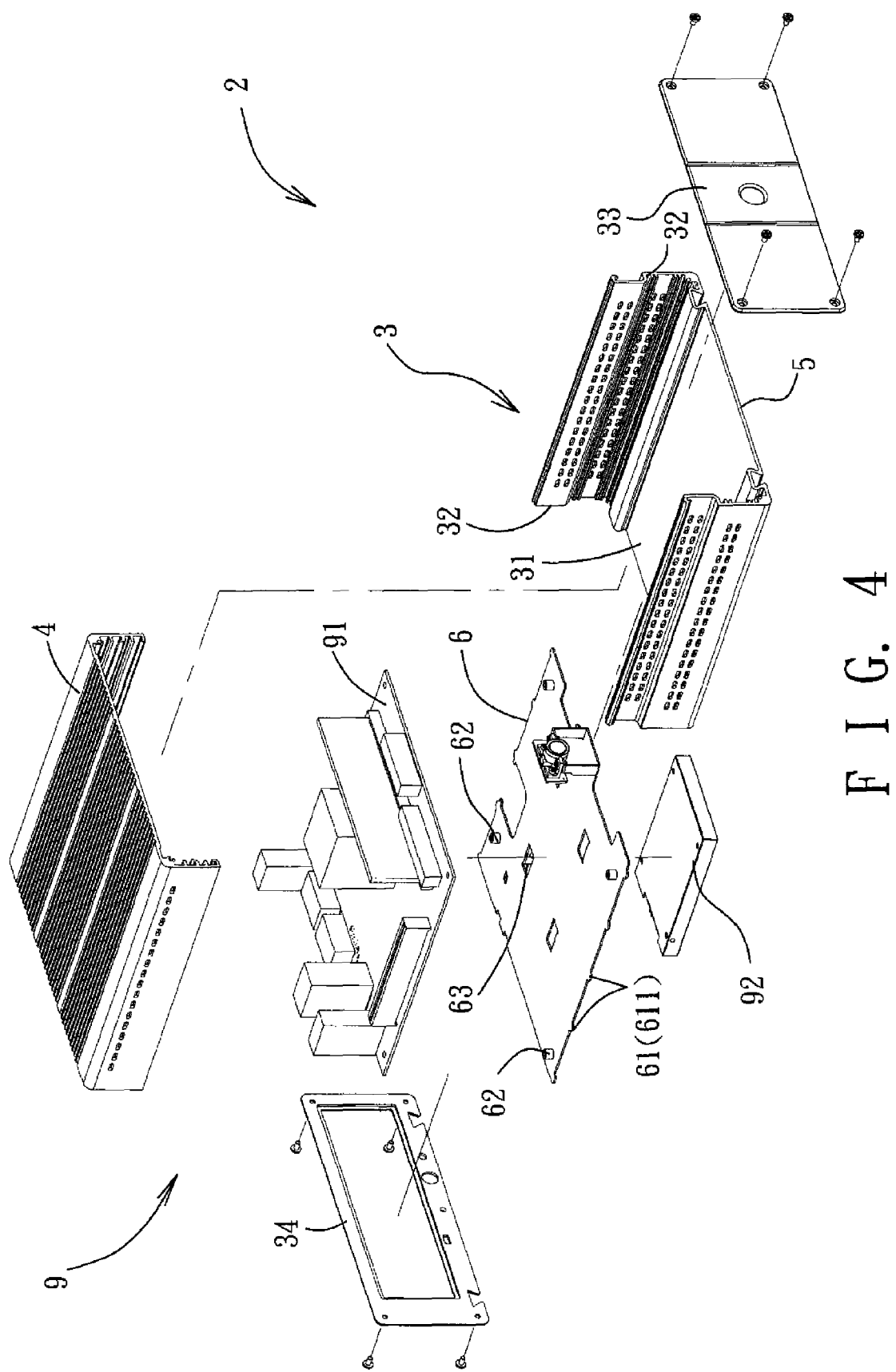
FIG. 4 is an exploded perspective view illustrating the preferred embodiment of FIG. 2.

Referring to FIGS. 2 and 4, the preferred embodiment of a computer 9 according to this invention includes a computer housing 2, and a motherboard 91 and an electronic component 92 received within the computer housing 2. In this embodiment, the electronic component 92 is a hard disk drive.

The computer housing 2 includes a housing unit 3 and a support board 6. The housing unit 3 includes a lower housing body 5, an upper housing body 4 mounted slidably on the lower housing body 5 along a sliding direction (which is a front-rear direction in this embodiment) and cooperating with the lower housing body 5 to define a receiving space 31 and two openings 32 at front and rear sides of the receiving space 31, an end cover 33 removably covering the opening 32 at the front side of the receiving space 31, and an end cover 34 removably covering the opening 32 at the rear side of the receiving space 31. The support board 6 is provided for securing the motherboard 91 and the electronic component 92 thereon, and is mounted slidably on the lower housing body 5.

Figure 3:
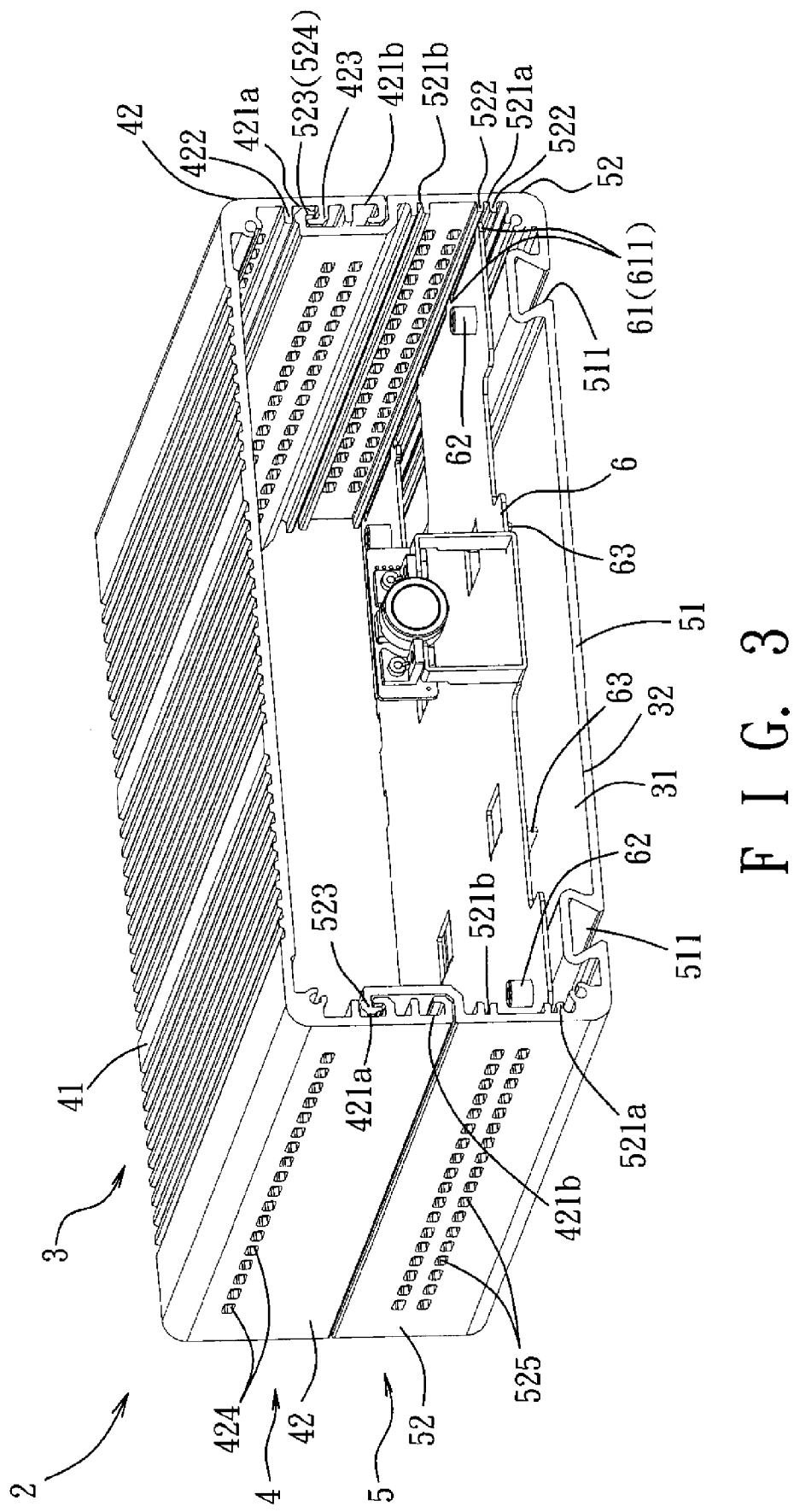
FIG. 3 is a perspective view illustrating a computer housing of the preferred embodiment of FIG. 2, in which a front end cover is removed.
Figure 5:
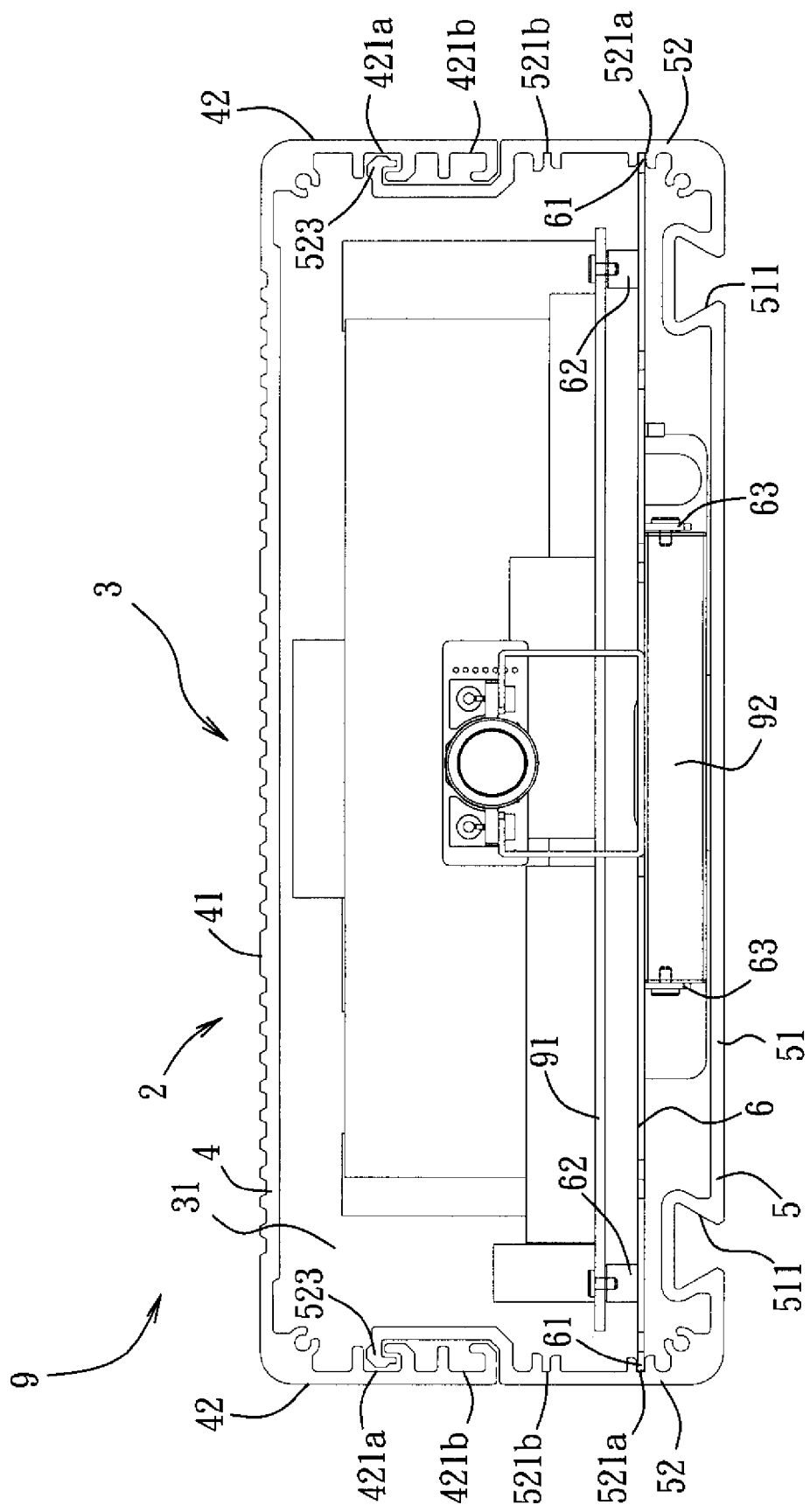
FIG. 5 is a front view of the preferred embodiment of FIG. 2, in which the front end cover is removed.

Referring to FIGS. 3 and 5, the lower housing body 5 includes a bottom plate 51 and two lower side plates 52 extending upwards and respectively from left and right edges of the bottom plate 51. In this embodiment, the bottom plate 51 and the lower side plates 52 are formed integrally.

The bottom plate 51 has an outer surface that is recessed inwardly to form two mounting grooves 511 extending along the front-rear direction and having an inverted trapezoidal cross section. A spacing distance between upper portions of the two lower side plates 52 is smaller than that between lower portions of the lower side plates 52. Each of the lower side plates 52 has a horizontal bent portion in a middle part thereof, and is formed with a fourth sliding portion 523 and first sliding portions 521b, 521a which are disposed in sequence from top to bottom and which extend along the sliding direction. The fourth sliding portion 523 is a third ledge 524 extending outwardly from an outer surface of a corresponding one of the lower side plates 52 and having a cross section of downward hook shape. The first sliding portions 521a, 521b of each of the lower side plates 52 are spaced apart with one above the other, and the first sliding portion 521a is disposed at a lower level than the first sliding portion 521b. Each of the first sliding portions 521a, 521b is a track defined by two horizontal plates 522 that are spaced apart from each other and that extend inwardly from an inner surface of the corresponding one of the lower side plates 52, and has a horizontal cross section. Additionally, each of the first sliding portions 521a, 521b extends to and is connected to the openings 32. The functions of the sliding portions 521a, 521b, 523 and the mounting grooves 511 will be described hereinbelow.

The upper housing body 4 includes a top plate 41 and two upper side plates 42 extending downwardly and respectively from left and right edges of the top plate 41. Lower portions of the upper side plates 42 correspondingly overlap the upper portions of the lower side plates 52, and outer surfaces of upper portions of the upper side plates 42 are correspondingly flush with the outer surfaces of the lower portions of the lower side plates 52. In this embodiment, the top plate 41 and the upper side plates 42 are formed integrally.

An inner surface of the lower portion of each of the upper side plates 42 which overlaps a corresponding one of the lower side plates 52 is formed with two third sliding portions 421a, 421b that extend along the sliding direction and that are located at different levels. The third sliding portion 421b is disposed at a level lower than that of the third sliding portion 421a. Each of the third sliding portions 421a, 421b is constituted by a first ledge 422 and a second ledge 423 that are spaced apart from each other and that extend inwardly from the inner surface of a corresponding one of the upper side plates 42. The first ledge 422 has a horizontal cross section, and the second ledge 423 is disposed below the first ledge 422 and has a cross section of an upward hook shape. The cross section cooperatively defined by the first ledge 422 and the second ledge 423 is complementary to that of the third ledge 524. Therefore, the fourth sliding portion 523 of each of the lower side plates 52 can be slidably engaged with one of the third sliding portions 421a, 421b of a corresponding one of the upper side plates 42, so that the upper housing body 4 can be slidably mounted on the lower housing body 5 along the sliding direction.

The support board 6 has one surface provided with a plurality of studs 62 and an opposite surface provided with a securing portion 63. The motherboard 91 is secured to the studs 62, and the electronic component 92 is secured to the securing portion 63. The support board 6 is formed with a second sliding portion 61 at each of left and right edges thereof. In this embodiment, the second sliding portion 61 includes a plurality of tabs 611 projecting from the corresponding edge of the support board 6. The thickness of each of the tabs 611 is the same as a spacing between the plates 522 of each of the first sliding portions 521a, 521b. Thus, the tabs 611 of each of the second sliding portions 61 of the support board 6 can be slidably mounted in a track defined by one of the first sliding portions 521a, 521b of a corresponding one of the lower side plates 52, so that the support board 6 is slidably mounted on the lower housing body 5 along the sliding direction. In this embodiment, the arrangement of the tabs 611 which are slidably disposed between the two plates 522 reduces frictional resistance that is generated when the support board 6 slides in the front-rear direction, thereby facilitating removal or insertion of the support board 6.

It is worth mentioning that the upper housing body 4 and the lower housing body 5 are each formed with a plurality of holes 424, 525 so as to enhance the heat dissipating effect of the computer 9. Additionally, since each of the upper housing body 4 and the lower housing body 5 has the same cross section along the front-rear direction, they can be made via aluminum extrusion, with the outer surfaces thereof anodized to increase surface hardness. Manufacturing costs can be reduced using aluminum extrusion.

Additionally, it is specifically noted that, in this embodiment, the third sliding portions 421a, 421b are formed on the inner surfaces of the upper side plates 42, and the fourth sliding portions 523 are formed on the outer surfaces of the lower side plates 52. However, in other embodiments of this invention, for example, if the upper side plates 42 correspondingly overlap the inner surfaces of the lower side plates 52, the third sliding portions 421a, 421b can be formed on the outer surfaces of the upper side plates 42, and the fourth sliding portions 523 can be formed on the inner surfaces of the lower side plates 52. The same effect can still be achieved.

In addition, in this embodiment, while the first sliding portions 521a, 521b are formed on the inner surfaces of the lower side plates 52, the first sliding portions 521a, 521b can be formed on the inner surfaces of the upper side plates 42 above the lower side plates 52 when the upper and lower side plates 42, 52 overlap.

As described above, since each of the lower side plates 52 includes two first sliding portions 521a, 521b located at different levels, and since each of the upper side plates 42 includes two corresponding third sliding portions 421a, 421b located at different levels, the computer 9 according to the preferred embodiment can be assembled in two different ways depending on different requirements.

The first way of assembling the computer 9 is suitable in a situation where the computer 9 has only one electronic component 92, i.e., where a relatively small receiving space 31 is required (see FIGS. 2, 4, and 5). The second way of assembling the computer 9 is suitable in a situation where the computer 9 has an electronic component 93 in addition to the electronic component 92, i.e., where a relatively large receiving space 31 is required (see FIGS. 6, 7, and 8). The two ways of assembling will be illustrated respectively as follows. In this embodiment, the electronic component 93 is an optical disk drive.

Referring to FIGS. 2, 4, and 5, when only the electronic component 92 (i.e., a hard disk drive) is to be installed by a user, the height of the space required below the support board 6 is relatively small. Therefore, the first way of assembling can be adopted.

During assembly, the third sliding portions 421a of the upper housing body 4 are correspondingly aligned with the fourth sliding portions 523 of the lower housing body 5, and the upper housing body 4 is then slidingly mounted on the lower housing body 5 along the sliding direction, with front and rear ends of the upper housing body 4 being flush with front and rear ends of the lower housing body 5, respectively. Subsequently, the end cover 34 is secured to the rear ends of the upper housing body 4 and the lower housing body 5. Thereafter, the motherboard 91 is secured to the studs 62 of the support board 6 from an upper side of the support board 6, and the electronic component 92 is secured to the securing portion 63 of the support board 6 from a lower side of the support board 6, thereby completing assembly of the motherboard 91 and the electronic component 92.

Subsequently, the second sliding portions 61 of the support board 6 are aligned with the first sliding portions 521a of the lower housing body 5 via the front opening 32, and the support board 6 is slid rearwardly to be mounted on the lower housing body 5 until the support board 6 is completely received within the receiving space 31. Finally, the end cover 33 is secured to the front ends of the upper housing body 4 and the lower housing body 5, thereby completing the whole assembly process.

It is noted that, if repair or replacement of any of the internal components of the computer 9 is required after the assembly, it is only necessary to remove the end cover 33 at the front and then slide the support board 6 forwardly to be removed from the lower housing body 5 for repair or replacement, which is relatively quick and convenient. Moreover, problems associated with the receiving space 31 being very small can be avoided.

Figure 6:
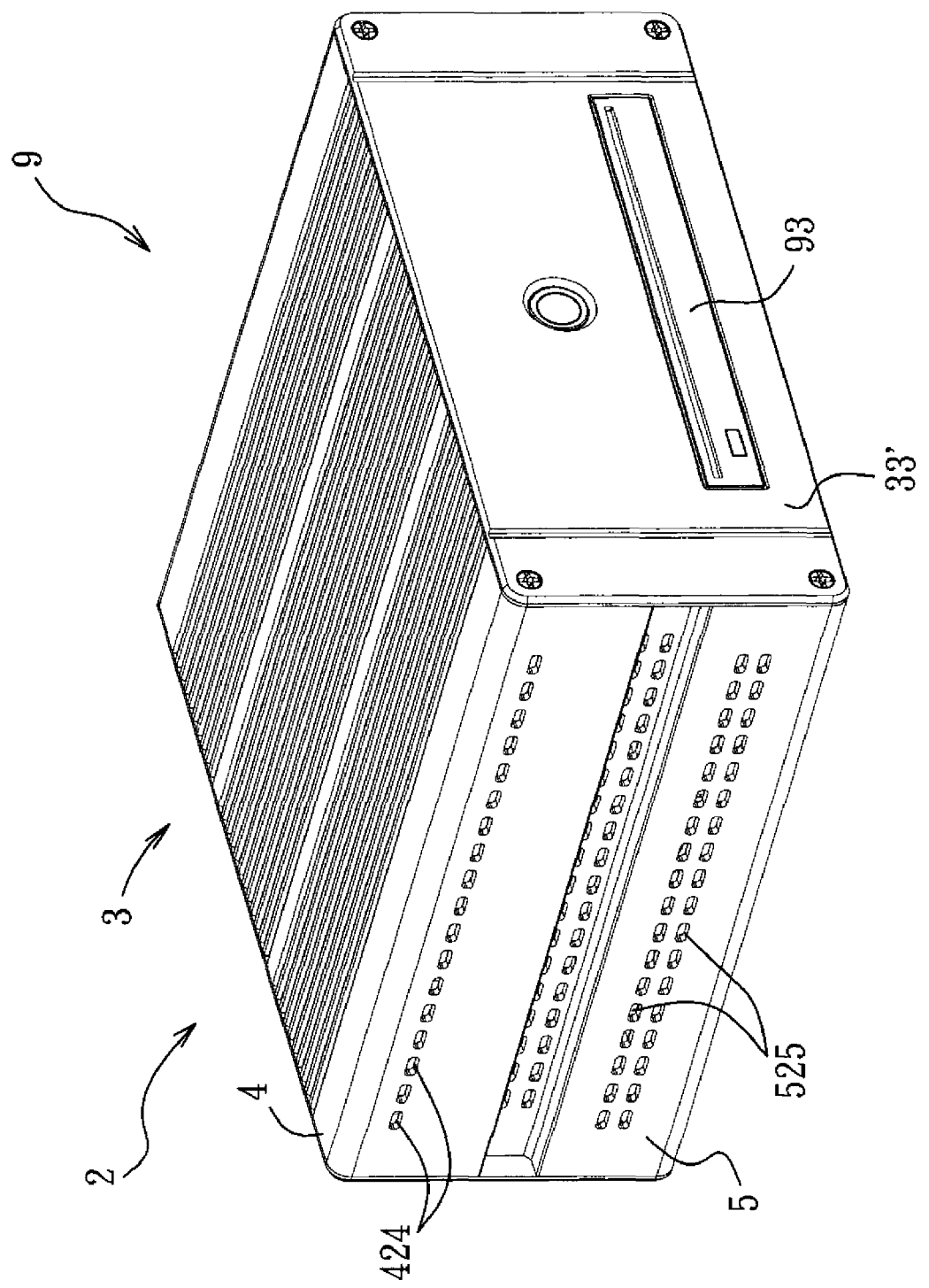
FIG. 6 is a perspective view of the preferred embodiment when assembled in a second way.
Figure 7:
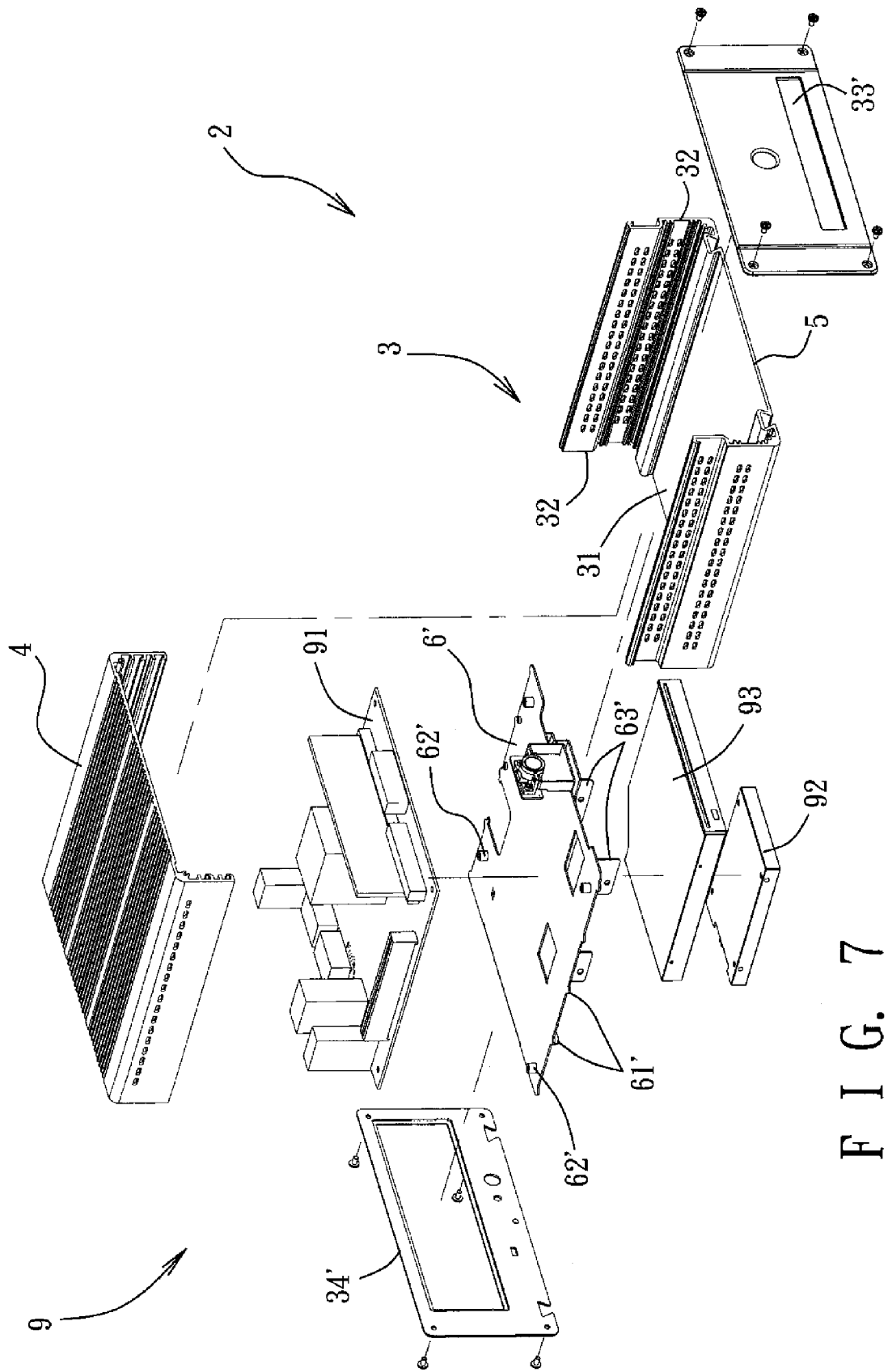
FIG. 7 is an exploded perspective view of the preferred embodiment of FIG. 6.
Figure 8:
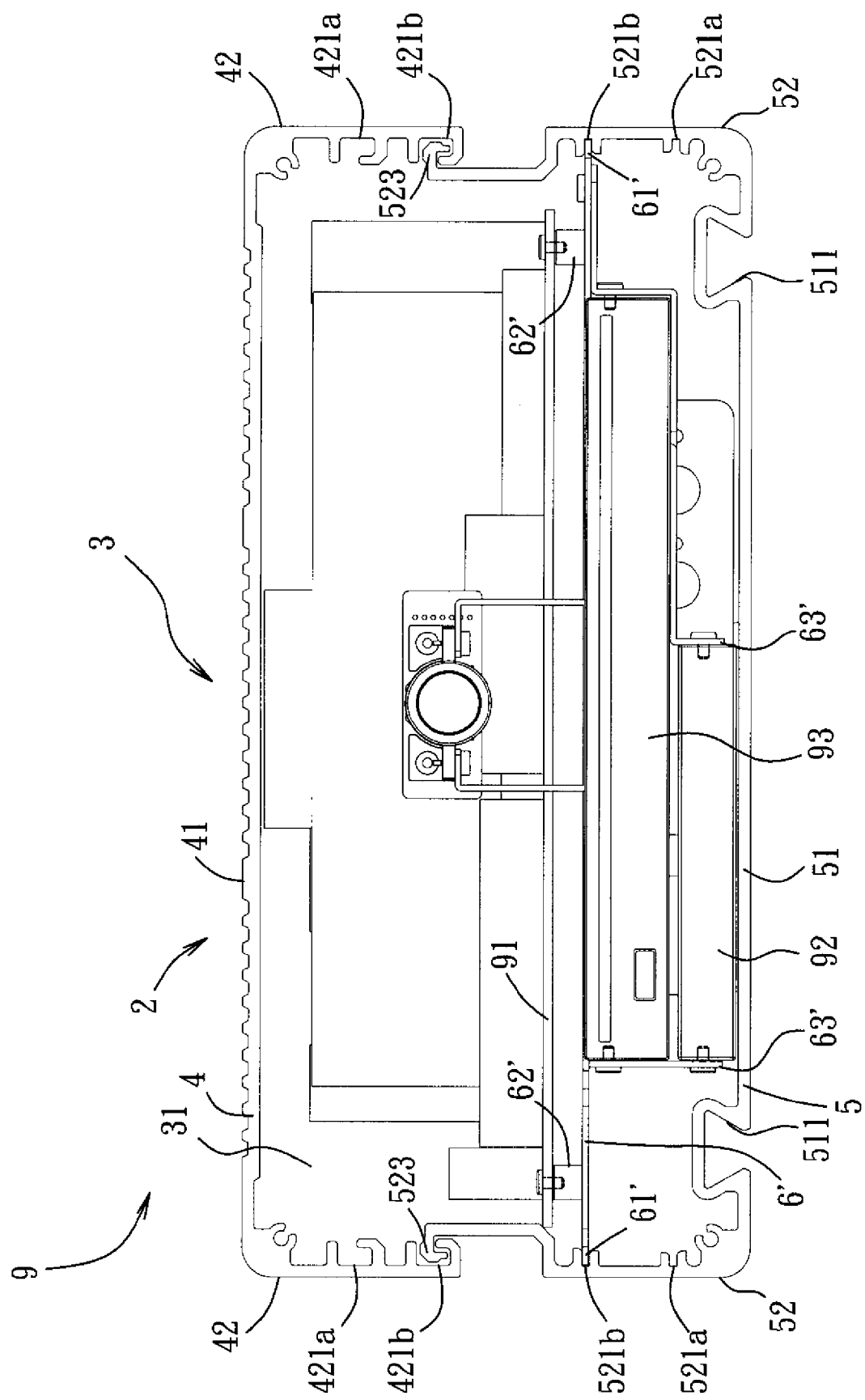
FIG. 8 is a front view of the preferred embodiment of FIG. 6, in which the front end cover is removed.

Referring to FIGS. 6, 7, and 8, when the user intends to expand the original architecture and to install an additional electronic component 93 (i.e., an optical disk drive), since the height of the space required below the support board 6' is relatively large, the second way of assembling is adopted.

In adopting the second way of assembling, since the total height of the computer 9 is different, another set of an end cover 33', an end cover 34', and a support board 6' should be used, in which the height of the end cover 33' is greater than that of the end cover 33, the height of the end cover 34' is greater than that of the end cover 34, and the securing portion 63' of the support board 6' extends further downward to accommodate the electronic components 92, 93. The assembly process will be illustrated as follows.

The third sliding portions 421b of the upper housing body 4 are first correspondingly aligned with the fourth sliding portions 523 of the lower housing body 5, and the upper housing body 4 is then slidingly mounted on the lower housing body 5 along the sliding direction, with the front and rear ends of the upper housing body 4 being flush with the front and rear ends of the lower housing body 5, respectively, thereby forming a receiving space 31 of a larger size (as compared to that when the first way of assembling is adopted). Subsequently, the end cover 34' is secured to the rear ends of the upper housing body 4 and the lower housing body 5. Thereafter, the motherboard 91 is secured to the studs 62' of the support board 6' from the upper side of the support board 6', the electronic component 93 is secured to the securing portion 63' of the support board 6' from the lower side of the support board 6', and the electronic component 92 is also secured to the securing portion 63' of the support board 6' from the lower side of the support board 6', thereby completing assembly of the motherboard 91 and the electronic components 92, 93.

Since the support board 6' has the two electronic components 92, 93 mounted therebelow, it needs to be mounted at a relatively high position. Therefore, the second sliding portions 61' of the support board 6' are aligned with the first sliding portions 521*b* of the lower housing body 5 via the front opening 32, and the support board 6' is slid rearwardly to be mounted on the lower housing body 5 until the support board 6' is completely received within the receiving space 31. Finally, the end cover 33' is secured to the front ends of the upper housing body 4 and the lower housing body 5, thereby completing the whole assembly process. Likewise, if any of the internal components of the computer 9 needs to be repaired or replaced after assembly, it is only necessary to remove the end cover 33' at the front and then slide the support board 6' forwardly to be removed from the lower housing body 5 for repair or replacement.

How the height at which the support board 6 is mounted is adjusted according to the requirements of the user, and how the height of the housing unit 3 is adjusted to adjust the size of the receiving space 31 are apparent from two above methods of assembling. It is specifically noted that, in this embodiment, each of the lower side plates 52 has only two first sliding portions 521*a*, 521*b*. However, the number of the first sliding portions may be one (in this case, the function of adjusting the height of the support board 6 is not available), or more than two.

Likewise, in this embodiment, each of the upper side plates 42 has only two third sliding portions 421*a*, 421*b*. However, the number of the third sliding portions may be one (in this case, the function of adjusting the size of the receiving space 31 is not available), or more than two.

In other embodiments of this invention, the upper housing body 4 and the lower housing body 5 can be formed integrally. In this case, the function of adjusting the size of the receiving space 31 is not available. The upper housing body 4, the lower housing body 5, and the end cover 34 for covering the opening 32 at the rear side of the receiving space 31 can even be formed integrally.

Accessories which can be used with the computer housing 2 are illustrated as follows. The user can use a mounting plate 7 (see FIG. 9) or resilient strips 8 (see FIG. 10) depending on requirements.

Figure 9:
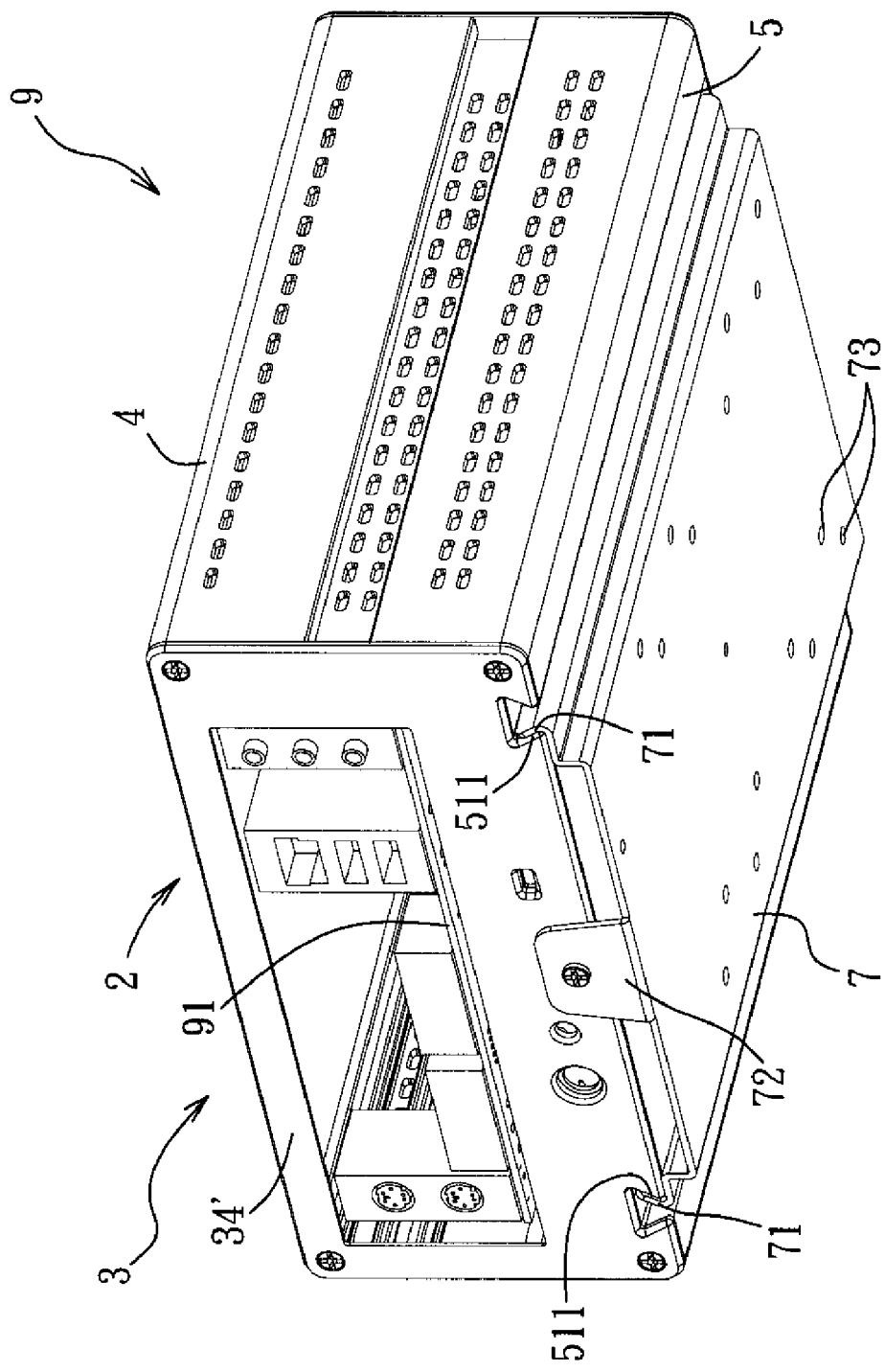
FIG. 9 is a perspective view illustrating the assembly relationship between the preferred embodiment and a mounting plate.

Referring to FIG. 9, the computer housing 2 further includes the mounting plate 7. The mounting plate 7 includes two mounting portions 71 extending upwardly and respectively from left and right edges of the mounting plate 7, and a locking portion 72 extending upwardly from a rear edge of the mounting plate 7. The mounting portions 71 are slid forwardly and respectively into the mounting grooves 511 in the lower housing body from a rear end of the housing unit 3 so as to be mounted therein. After the mounting portions 71 are installed in place, the locking portion 72 is locked to the end cover 34. With the provision of locking holes 73 in the mounting plate 7, the computer 9 can be secured to a display (not shown) or a wall depending on the user's requirement.

Figure 10:
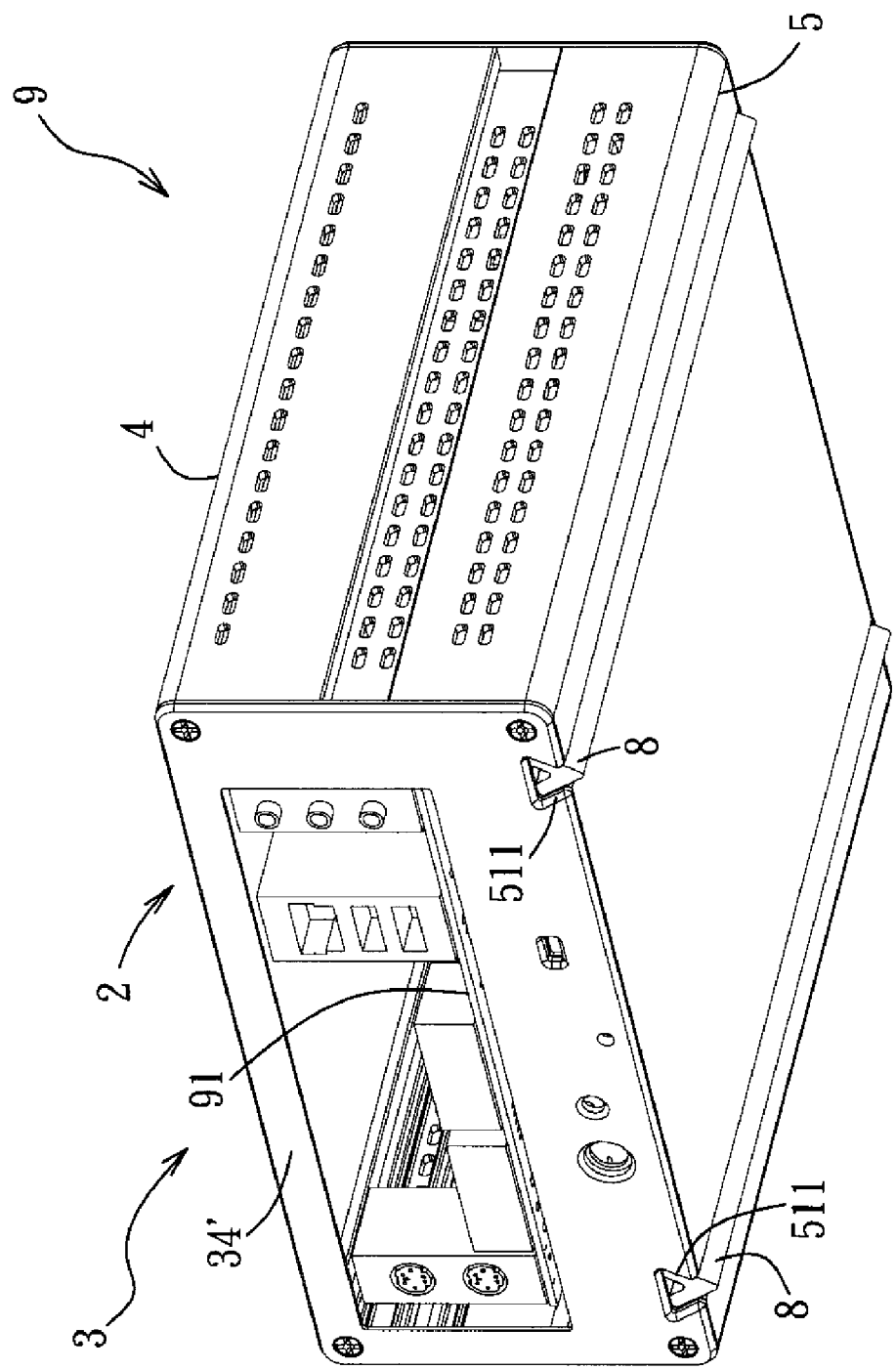
FIG. 10 is a perspective view illustrating the assembly relationship between the preferred embodiment and two resilient strips.

Referring to FIG. 10, the computer housing 2 further includes two resilient strips 8. Each of the resilient strips 8 has a V-shaped cross-section, and is mounted in a corresponding one of the mounting grooves 511, with a portion thereof protruding from the corresponding one of the mounting grooves 511. When the computer 9 is placed on a planar surface, friction between the lower housing body 5 and the planar surface can be reduced by virtue of the configuration of the resilient strips 8.

In sum, with the arrangement of the second sliding portions 61, 61' of the support board 6,6' which are slidable relative to the first sliding portions 521*a*, 521*b* of the housing unit 3 in the sliding direction, the motherboard 91 and the electronic components 92, 93 secured on the support board 6 can be removed together with the support board 6, thereby achieving quick assembly with the use of a sliding track design. Furthermore, since the two first sliding portions 512*a*, 521*b* of each of the lower side plates 52 are disposed at different levels, and since the two third sliding portions 421*a*, 421*b* of each of the upper side plates 42 are also disposed at different levels, this invention further has the advantage of permitting adjustment of the mounting position of the support board 6 and adjustment of the height of the housing unit 3 depending on the user's requirements.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

We claim:

1. A computer housing adapted for receiving a motherboard therein, comprising:

a housing unit having an opening, and including at least one first sliding portion that is provided at each of two opposite sides of an inner surface of said housing unit, that extends along a sliding direction, and that is connected to said opening; and a support board adapted for securing the motherboard, and including a second sliding portion provided at each of two opposite edges of said support board and slidable relative to said first sliding portion in said sliding direction, wherein said housing unit further includes a lower housing body, and an upper housing body mounted slidably on said lower housing body along said sliding direction and cooperating with said lower housing body to define a receiving space, said lower housing body including a bottom plate and two lower side plates extending upwards and respectively from left and right edges of said bottom plate, said upper housing body including a top plate and two upper side plates extending downwardly and respectively from left and right edges of said top plate, said first sliding portion being provided at one of an inner surface of each of said upper side plates and an inner surface of each of said lower side plates, wherein said two upper side plates and said two lower side plates are respectively formed with at least one third sliding portion and a fourth sliding portion at a portion where said upper and lower side plates are adjacent to one another, said third and fourth sliding portions extending along said sliding direction and being connected slidably to each other, and wherein said third sliding portion is constituted by a first ledge and a second ledge that are spaced apart from each other and that extend inwardly from said inner surface of a corresponding one of said upper side plates, said first ledge having a horizontal cross section, said second ledge being disposed below said first ledge and having a cross section of upward hook shape, said fourth sliding portion being a third ledge extending outwardly from said outer surface of a corresponding one of said lower side plates and having a cross section of downward hook shape.

2. The computer housing as claimed in claim 1, wherein said housing unit includes two of said first sliding portions, which are respectively provided at each of said two opposite sides of said inner surface of said housing unit, and which are spaced apart from each other.

3. The computer housing as claimed in claim 2, wherein said first sliding portions are provided at said inner surface of each of said lower side plates.

4. The computer housing as claimed in 1, wherein each of said upper side plates has a surface formed with two of said third sliding portions, which are located at different levels.

5. The computer housing as claimed in claim 4, wherein said third sliding portions are formed on said inner surface of each of said upper side plates, and said fourth sliding portion is formed on an outer surface of each of said lower side plates.

6. The computer housing as claimed in claim 1, wherein said first sliding portion is a track defined by two plates that are spaced apart from each other and that extend inwardly from said inner surface of said housing unit.

7. The computer housing as claimed in claim 6, wherein said second sliding portion of said support board includes a plurality of tabs projecting from a corresponding one of said edges of said support board and slidably mounted in said track.

8. The computer housing as claimed in claim 1, wherein said support board has one surface provided with a plurality of studs adapted for securing the motherboard, and an opposite surface provided with a securing portion adapted for securing at least one electronic component.

9. A computer comprising:
a motherboard; and
a computer housing for receiving said motherboard therein, and including
a housing unit having an opening, and including at least one first sliding portion that is provided at each of two opposite sides of an inner surface of said housing unit, that extends along a sliding direction, and that is connected to said opening, and
a support board having said motherboard secured thereon, and including a second sliding portion provided at each of two opposite edges of said support board and slidable relative to said first sliding portion in said sliding direction,
wherein said housing unit further includes a lower housing body, and an upper housing body mounted slidably on said lower housing body along said sliding direction and cooperating with said lower housing body to define a receiving space, said lower housing body including a bottom plate and two lower side plates extending upwards and respectively from left and right edges of said bottom plate, said upper housing body including a top plate and two upper side plates extending downwardly and respectively from left and right edges of said top late said first sliding portion being provided at one of an inner surface of each of said upper side plates and an inner surface of each of said lower side plates,
wherein said two upper side plates and said two lower side plates are respectively formed with at least one third sliding portion and a fourth sliding portion at a portion where said upper and lower side plates are adjacent to one another, said third and fourth sliding portions extending along said sliding direction and being connected slidably to each other, and
wherein said third sliding portion is constituted by a first ledge and a second ledge that are spaced apart from each other and that extend inwardly from said inner surface of a corresponding one of said upper side plates, said first ledge having a horizontal cross section, said second ledge being disposed below said first ledge and having a cross section of upward hook shape, said fourth sliding portion being a third ledge extending outwardly from said outer surface of a corresponding one of said lower side plates and having a cross section of downward hook shape.

10. The computer as claimed in claim 9, wherein said housing unit includes two of said first sliding portions, which are respectively provided at each of said two opposite sides of said inner surface of said housing unit, and which are spaced apart from each other.

11. The computer as claimed in claim 10, wherein said first sliding portions are provided at said inner surface of each of said lower side plates.

12. The computer as claimed in claim 9, wherein each of said upper side plates has a surface formed with two of said third sliding portions, which are located at different levels.

13. The computer as claimed in claim 12, wherein said third sliding portions are formed on said inner surface of each of said upper side plates, and said fourth sliding portion is formed on an outer surface of each of said lower side plates.

14. The computer as claimed in claim 9, wherein said first sliding portion is a track defined by two plates that are spaced apart from each other and that extend inwardly from said inner surface of said housing unit.

15. The computer as claimed in claim 14, wherein said second sliding portion of said support board includes a plurality of tabs projecting from a corresponding one of said edges of said support board and slidably mounted in said track.

16. The computer as claimed in claim 9, wherein said support board has one surface provided with a plurality of studs for securing said motherboard, and an opposite surface provided with a securing portion adapted for securing at least one electronic component.

* * * * *